United States Patent
Lee

(10) Patent No.: US 7,672,174 B2
(45) Date of Patent: Mar. 2, 2010

(54) EQUALIZING CIRCUIT FOR SEMICONDUCTOR MEMORY DEVICE

(75) Inventor: Kang-Seol Lee, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 155 days.

(21) Appl. No.: 11/528,514

(22) Filed: Sep. 28, 2006

(65) Prior Publication Data

US 2007/0070747 A1    Mar. 29, 2007

(30) Foreign Application Priority Data

Sep. 29, 2005  (KR)  ................ 10-2005-0091591
Apr. 28, 2006  (KR)  ................ 10-2006-0038716

(51) Int. Cl.
    *G11C 7/10*  (2006.01)
(52) U.S. Cl. ............. 365/189.06; 365/203; 365/189.09; 365/192
(58) Field of Classification Search ................ 365/203, 365/189.06, 189.09, 192
    See application file for complete search history.

(56) References Cited

U.S. PATENT DOCUMENTS

| | | | |
|---|---|---|---|
| 5,268,874 A * | 12/1993 | Yamauchi | ................ 365/233.5 |
| 5,689,469 A * | 11/1997 | Asaka et al. | ................ 365/203 |
| 5,828,614 A | 10/1998 | Gradinariu | |
| 6,275,429 B1 | 8/2001 | Bae et al. | |
| 6,551,846 B1 * | 4/2003 | Furutani et al. | ................ 257/48 |
| 6,570,916 B1 | 5/2003 | Feldbaumer et al. | |
| 7,038,954 B2 * | 5/2006 | Jung | ................ 365/189.07 |
| 7,417,909 B2 * | 8/2008 | Byeon et al. | ................ 365/203 |
| 2001/0030898 A1 * | 10/2001 | Kuge et al. | ................ 365/205 |
| 2002/0036942 A1 * | 3/2002 | Ooishi | ................ 365/226 |
| 2003/0071679 A1 * | 4/2003 | Kono et al. | ................ 327/538 |
| 2003/0202390 A1 * | 10/2003 | Narui et al. | ................ 365/200 |
| 2005/0237833 A1 * | 10/2005 | Byeon et al. | ................ 365/203 |
| 2006/0097759 A1 * | 5/2006 | Omori et al. | ................ 327/108 |
| 2006/0255852 A1 * | 11/2006 | O'Donnell et al. | ................ 327/437 |

FOREIGN PATENT DOCUMENTS

| | | |
|---|---|---|
| JP | 2005-276348 | 10/2005 |
| KR | 1997-0029753 | 6/1997 |
| KR | 10-2005-0029886 | 3/2005 |
| KR | 10-2005-0101893 | 10/2005 |

* cited by examiner

*Primary Examiner*—Thong Q Le
(74) *Attorney, Agent, or Firm*—IP & T Law Firm PLC

(57) ABSTRACT

A semiconductor memory device includes an equalizing signal generation circuit comprising a clamping circuit that clamps a voltage level less than the voltage level of a high voltage level by being controlled by the high voltage, and an equalizing signal driver receiving an output signal of the equalizing signal generation circuit as a driving signal.

7 Claims, 5 Drawing Sheets

EQUALIZING CIRCUIT FOR SEMICONDUCTOR MEMORY DEVICE

FIELD OF THE INVENTION

The present invention relates to a semiconductor technology, and more particularly, to a semiconductor memory device comprising an equalizing signal generation circuit.

DESCRIPTION OF RELATED ARTS

Currently, many researchers are attempting to develop semiconductor memory devices that can operate at fast rate. Also, researchers are attempting to develop those semiconductor memory devices that can operate at low voltage with good reliability. Particularly, memories installed within mobile systems such as cellular phones or laptop computers are also being developed to consume the minimum power.

One exemplary memory development is a technology of minimizing the power consumption in a core region of a memory. The typical core region includes memory cells, bit lines and word lines and is designed based on a design rule focusing on the micronization. Thus, it is generally required to fabricate memory cells that are smaller and can operate at low voltage. An equalizing signal of a low voltage semiconductor memory device is used as an enable signal for precharge units used to precharge power lines and segmental input/output lines of bit lines or bit line sense amplifiers.

FIG. 1 illustrates a block diagram of an equalizing signal generation circuit and a precharge block of a typical low voltage semiconductor memory device.

The equalizing signal generation circuit 101 generates an equalizing signal BLEQ having a voltage level of a high voltage VPP or a power supply voltage VDD. The precharge block 103 includes a precharge unit for a bit line sense amplifier (BSA), a precharge unit for a BSA power line and a precharge unit for a segmental input/output line. The precharge block 103 operates in response to the equalizing signal BLEQ, which instructs precharging of the BSA, the BSA power line and the segmental input/output line to a voltage VBLP.

FIG. 2 illustrates a block diagram of the typical equalizing signal generation circuit 101.

The equalizing signal generation circuit 101 includes a voltage level detector 201, an oscillator 203, a control circuit 205, and a triple pump 207. The voltage level detector 201 detects a voltage level of a high voltage VPP. The oscillator 203 generates an oscillation signal in response to an output signal of the voltage level detector 201. The control circuit 205 controls the triple pump 207 in response to the oscillation signal of the oscillator 203. The triple pump 207 boosts a power supply voltage VDD by threefold. The triple pump 207 is a typical voltage tripler as illustrated in FIGS. 3A and 3B. The output voltage of the triple pump 207 that has a voltage level being triple the original voltage level is generally referred to as the high voltage VPP.

The high voltage VPP of a low voltage semiconductor memory device cannot be generated by a double pump but generated by a triple pump. Thus, in respect of the pump efficiency, a large amount of current is unnecessarily dissipated. Driving a driving transistor of the precharge block 103 (refer to FIG. 1) using the equalizing signal BLEQ that has a voltage level of the high voltage VPP may cause the dissipation of the large amount of current. If the equalizing signal BLEQ has a voltage level of the power supply voltage VDD, the current dissipation decreases; however, refresh time tRP increases. As a result, operation of the semiconductor memory device is often delayed. Hence, a repeater that repeats the equalizing signal BLEQ is provided to overcome the limitations such as the delayed operation period. The repeater is disposed at a sub-hole region defined between a BSA array and sub-word line drivers that drive sub-word lines, each including memory cells.

The repeater includes a P-type channel metal-oxide semiconductor (PMOS) transistor that receives the equalizing signal BLEQ through a gate of the PMOS transistor and outputs the equalizing signal BLEQ that has a voltage level of the power supply voltage VDD. When one terminal of the PMOS transistor is supplied with the power supply voltage VDD, a latch-up event is likely to occur due to a high voltage level of the power supply voltage VDD supplied at an initial power-up sequence. Thus, reliability of a chip may be degraded.

As one approach to overcome the above limitations, the high voltage VPP is generated and then down converted to generate a voltage VPPY for the equalizing signal BLEQ for the purpose of reducing the latch-up event. Although this approach allows an occurrence of latch-up, it may be disadvantageous of current saving because a high amount of current is dissipated during a voltage boosting operation using the triple pump to generate the high voltage VPP.

SUMMARY OF THE INVENTION

It is, therefore, an object of the present invention to provide a semiconductor memory device comprising an equalizing generation circuit that can reduce current dissipation by reducing a voltage level of the equalizing generation circuit.

It is another object of the present invention to provide a semiconductor memory device comprising an equalizing generation circuit that can reduce an incidence of latch-up.

In accordance with an aspect of the present invention, there is provided a semiconductor memory device, including: an equalizing signal generation circuit comprising a clamping circuit that clamps a voltage level less than that of a high voltage by being controlled by the high voltage; and an equalizing signal driver receiving an output signal of the equalizing signal generation circuit as a driving signal.

In accordance with another aspect of the present invention, there is provided a semiconductor memory device, including: a first high voltage generator generating a first high voltage by increasing a voltage level of a power supply voltage; a main circuit using the power supply voltage and the first high voltage; a second high voltage generator generating a second high voltage by increasing a voltage level of the power supply voltage, the second high voltage having a voltage level less than that of the first high voltage and greater than that of the power supply voltage; and a precharge block controlling the second high voltage to be used as a precharge voltage of the main circuit.

BRIEF DESCRIPTION OF THE DRAWINGS

The above and other objects and features of the present invention will become better understood with respect to the following description of the exemplary embodiments given in conjunction with the accompanying drawings, in which.

DETAILED DESCRIPTION OF THE INVENTION

A semiconductor memory device in accordance with various embodiments of the present invention will be described in detail with reference to the accompanying drawings.

Figure 1:
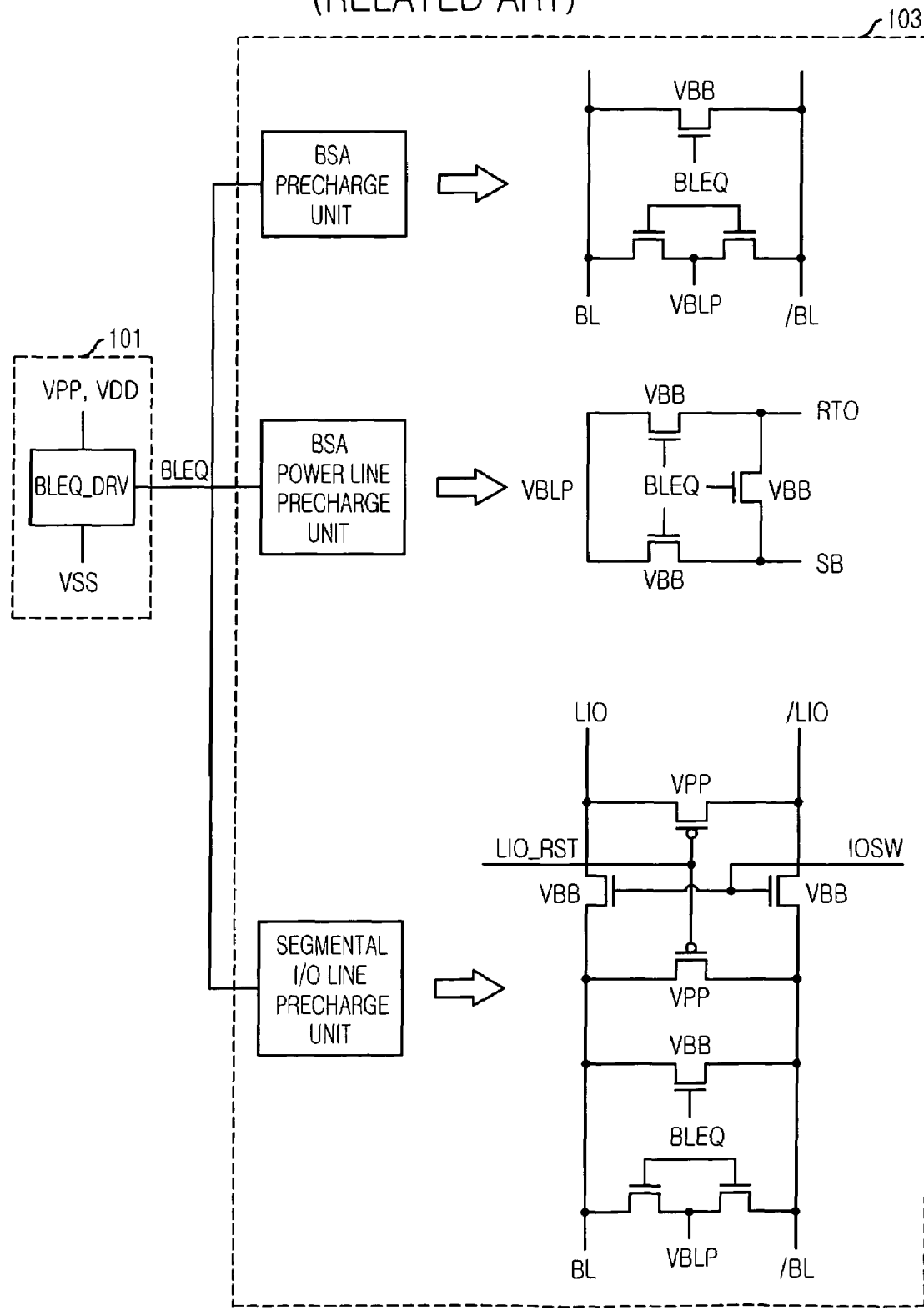
FIG. 1 illustrates a block diagram of an equalizing signal generation circuit and a precharge block to which an equalizing signal is inputted in a typical low voltage semiconductor memory device.
Figure 2:
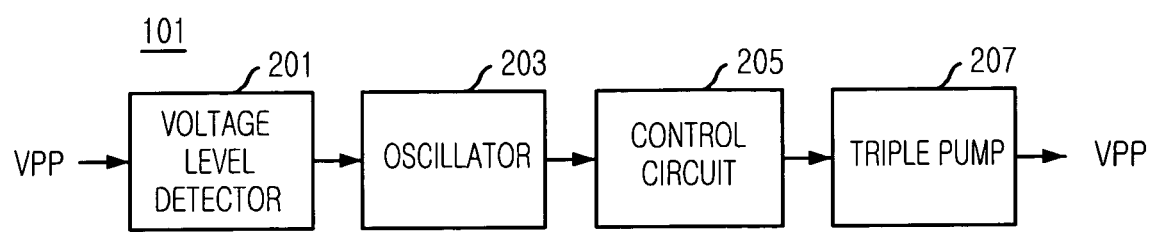
FIG. 2 illustrates a block diagram of a typical equalizing signal generation circuit.
Figure 3A:
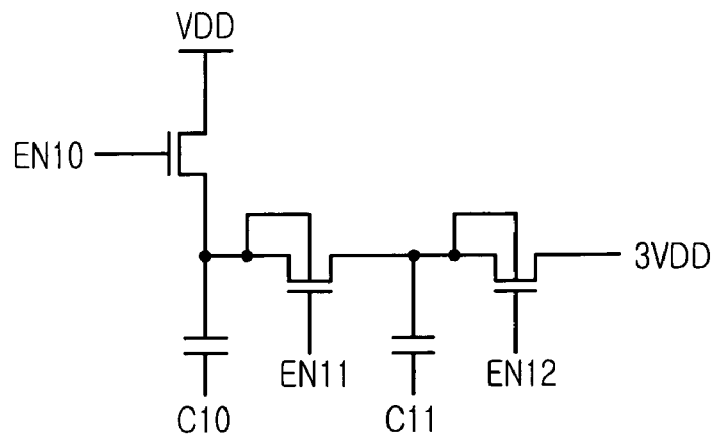
FIGS. 3A and 3B illustrate exemplary circuit diagrams of typical triple pumps.
Figure 3B:
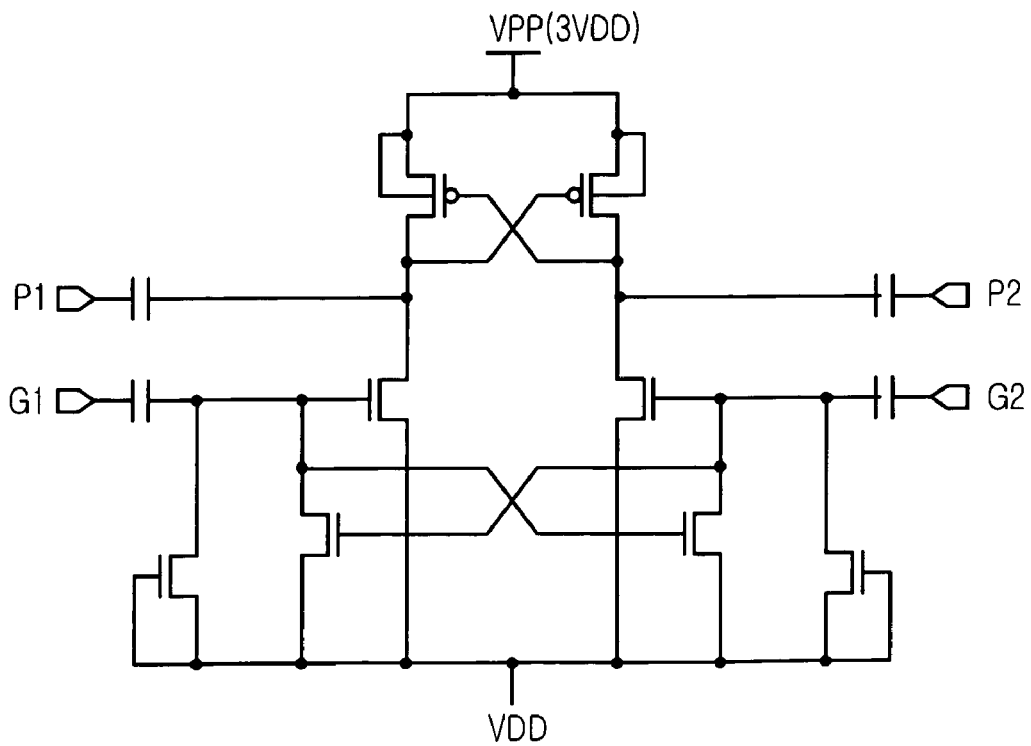
Figure 4:
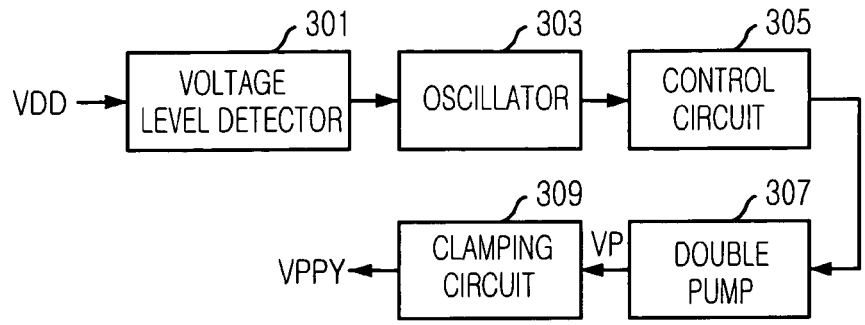
FIG. 4 illustrates a configuration diagram of an equalizing signal generation circuit in accordance with an embodiment of the present invention.

FIG. 4 illustrates a configuration diagram of an equalizing signal generation circuit of a semiconductor memory device in accordance with an embodiment of the present invention.

The equalizing signal generation circuit includes a voltage level detector 301, an oscillator 303, a control circuit 305, a double pump 307, and a clamping circuit 309. The voltage level detector 301 detects a voltage level to sustain a consistent voltage level. The oscillator 303 generates an oscillation signal in response to an output signal of the voltage level detector 301. The control circuit 305 controls the double pump 307 in response to the oscillation signal of the oscillator 303. The double pump 307 boosts a power supply voltage VDD by twofold in response to an output signal of the control circuit 305. The clamping circuit 309 clamps a voltage VP that is boosted by the double pump 307. The voltage level detector 301, the oscillator 303 and the control circuit 305 use circuits typically used in a boost voltage generator. Although not illustrated, the semiconductor memory device further includes an equalizing signal driver receiving an output signal of the equalizing signal generation circuit as a driving signal. The equalizing signal driver includes a power line precharge driver of a bit line sense amplifier, a data transmission precharge driver and a segmental input/output line precharge driver.

Figure 5:
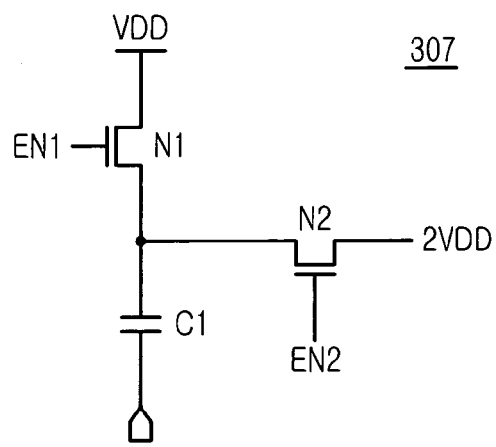
FIG. 5 illustrates a circuit diagram of a double pump illustrated in FIG. 4.

FIG. 5 illustrates a circuit diagram of the double pump 307 illustrated in FIG. 4.

The double pump 307 includes a first N-type channel metal-oxide semiconductor (NMOS) transistor N1, a capacitor C1 and a second NMOS transistor N2. The first NMOS transistor N1 transfers a power supply voltage VDD to the capacitor C1. The capacitor C1 stores the transferred power supply voltage VDD, and the second NMOS transistor N2 outputs a voltage VP, which has a voltage level twice the voltage level of the power supply voltage VDD due to the stored voltage on the capacitor C1 and the power supply voltage VDD transferred to the first NMOS transistor N1. Since the double pump 307 operates substantially the same as the typical double pump, detailed description thereof will be omitted. Hereinafter, the clamping circuit 309 will be described in detail.

Figure 6:
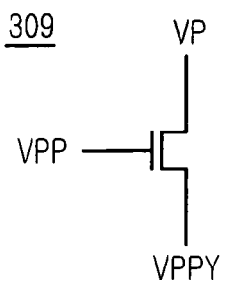
FIG. 6 illustrates a circuit diagram of a clamping circuit illustrated in FIG. 4.

FIG. 6 illustrates a circuit diagram of the clamping circuit 309 illustrated in FIG. 4.

The clamping circuit 309 includes an NMOS transistor that receives a high voltage VPP through a gate of the NMOS transistor and outputs an equalizing signal having a voltage VPPY whose voltage level is clamped from the voltage level of the voltage VP (i.e., the output voltage of the double pump 307). The clamping circuit 309 is provided to reduce a latch-up event within a semiconductor memory device. The role of the clamping circuit 309 will be described in detail herein below.

Figure 7:
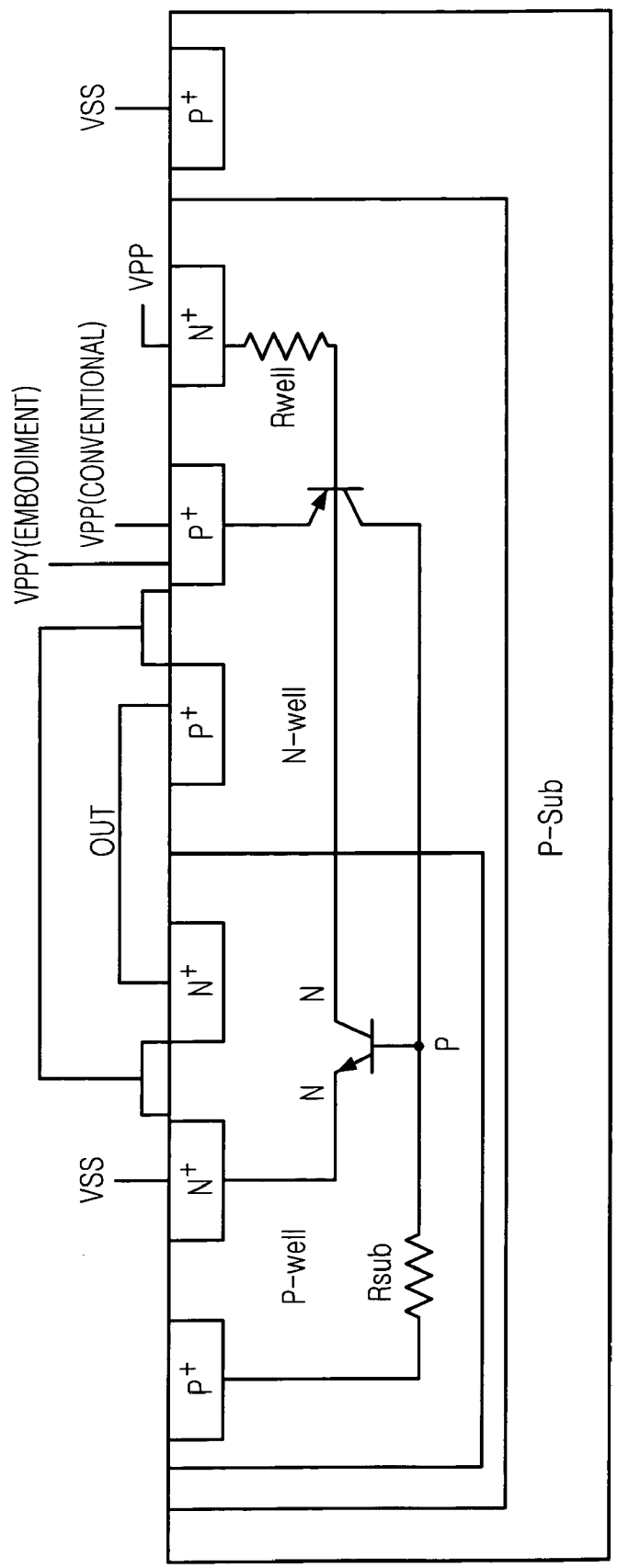
FIG. 7 illustrates a circuit diagram of NMOS transistors in a cell region and PMOS transistors of an equalizing signal repeater according to an embodiment of the present invention.

FIG. 7 illustrates a circuit diagram of NMOS transistors in a cell region and PMOS transistors of an equalizing signal repeater according to an embodiment of the present invention.

A P-type well needs to be used in the cell region where NMOS transistors are formed to supply a bulk bias voltage. Those regions shielded by the N-type well are PMOS transistor regions. A high voltage VPP is supplied as the bulk bias voltage for the N-type well to increase a yield.

The MOS transistor structure gives rise to a structure of $P^+NPN^+$ or $N^+PNP^+$, thereby forming two parasitic bipolar transistors. The two parasitic bipolar transistors interact with each other because of impedance generated between a terminal of the bulk bias voltage of the PMOS transistor and a terminal of the bulk bias voltage of the NMOS transistor to which the ground voltage VSS is supplied. As a result, current flows overly from the bulk bias voltage terminal of the PMOS transistor to the bulk bias voltage terminal of the NMOS transistor, causing an erroneous operation. This erroneous operation is called a latch-up event.

If a voltage level of the voltage VP, which is twice the voltage level of the power supply voltage VDD, is greater than that of the bulk bias voltage during a power-up sequence or bumping activity, a latch-up event is likely to occur. However, using a clamped voltage VPPY supplied through the gate of the NMOS transistor can reduce an incidence that a voltage level of the voltage VPPY is greater than that of the high voltage VPP. As a result, the latch-up event is less likely to occur. Also, the double pump allows the reduction in current dissipation, which is usually exhibited when using the typical triple pump.

As described above, in the present embodiment, the voltage VP whose level is twice the voltage level of the power supply voltage VDD is clamped using the clamping circuit. As a result, the latch-up event is less likely to occur. Also, stability of a chip can be secured. The equalizing signal is generated using the double pump that boosts the power supply voltage VDD by twofold, unnecessary current dissipation does not occur while the semiconductor memory device performs a precharge operation.

The present application contains subject matter related to the Korean patent application Nos. KR 2005-0091591 and 2006-0038716, filed in the Korean Patent Office respectively on Sep. 29, 2005, and Apr. 28, 2006, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims. For instance, the logic types and device layout described in the above embodiments are exemplary implementations when the input signals and output signals are activated to a logic high state. Thus, when the logic states of the signals are changed, the illustrated implementations are also changed. Thus, many other implementations are possible; however, these implementations will not be described in detail to prevent any potential abusive technical adaptation or modification by those skilled in the art. Also, the voltage level detector, oscillator and the control circuit can be implemented using the typical circuits known in the art.

What is claimed is:

1. An equalizing circuit comprising:
    an equalizing signal generation circuit comprising a clamping circuit that clamps a voltage level of an equalizing signal less than the voltage level of a high voltage by being controlled by the high voltage; and an equalizing signal driver receiving the equalizing signal as a driving signal and comprising a power line precharge driver of a bit line sense amplifier, a data transmission precharge driver and a segmental input/output line precharge driver.

2. The equalizing circuit of claim 1, wherein the equalizing signal generation circuit comprises:
   a voltage level detector detecting a voltage level of a power supply voltage;
   an oscillator generating an oscillation signal in response to an output signal of the voltage level detector;
   a control circuit receiving the oscillation signal of the oscillator; and
   a double pump boosting the power supply voltage by twofold in response to an output signal of the control circuit.

3. The equalizing circuit of claim 2, wherein the clamping circuit comprises a first N-type channel metal-oxide semiconductor (NMOS) transistor receiving the high voltage through a gate of the NMOS transistor.

4. The equalizing circuit of claim 2, wherein the double pump comprises:
   a first NMOS transistor transferring the power supply voltage to a capacitor;
   the capacitor storing the transferred power supply voltage; and
   a second NMOS transistor simultaneously outputting the stored voltage and the power supply voltage.

5. A precharging circuit comprising:
   a voltage generator generating a voltage by increasing a voltage level of a power supply voltage;
   a precharge signal generator generating a precharge signal by clamping the voltage output from the voltage generator less than a boosted voltage; and
   a precharge block controlling a precharge operation using the precharge signal and precharging one selected from a group consisting of a bit line, a power transfer line and a local data transmission line.

6. An equalizing circuit comprising:
   an equalizing signal generation circuit comprising a clamping circuit that clamps a voltage level of an equalizing signal less than the voltage level of a high voltage by being controlled by the high voltage; and
   an equalizing signal driver receiving the equalizing signal as a driving signal,
   wherein the equalizing signal generation circuit further includes:
      a voltage level detector detecting a voltage level of a power supply voltage;
      an oscillator generating an oscillation signal in response to an output signal of the voltage level detector;
      a control circuit receiving the oscillation signal of the oscillator; and
      a double pump boosting the power supply voltage by twofold in response to an output signal of the control circuit.

7. The equalizing circuit of claim 6, wherein the equalizing signal driver comprises a power line precharge driver of a bit line sense amplifier, a data transmission precharge driver and a segmental input/output line precharge driver.

\* \* \* \* \*